US010235272B2

(12) United States Patent
Villarreal et al.

(10) Patent No.: US 10,235,272 B2
(45) Date of Patent: Mar. 19, 2019

(54) DEBUGGING SYSTEM AND METHOD

(71) Applicant: Xilinx, Inc., San Jose, CA (US)

(72) Inventors: Jason Villarreal, Los Gatos, CA (US);
Mahesh Sankroj, Secunderabad (IN);
Nikhil A. Dhume, Hyderabad (IN);
Kumar Deepak, San Jose, CA (US)

(73) Assignee: XILINX, INC., San Jose, CA (US)

( * ) Notice: Subject to any disclaimer, the term of this patent is extended or adjusted under 35 U.S.C. 154(b) by 116 days.

(21) Appl. No.: 15/451,068

(22) Filed: Mar. 6, 2017

(65) Prior Publication Data

US 2018/0253368 A1 Sep. 6, 2018

(51) Int. Cl.
*G06F 11/36* (2006.01)
*G06F 17/50* (2006.01)
*G06F 11/277* (2006.01)
*G06F 9/44* (2018.01)

(52) U.S. Cl.
CPC ........ *G06F 11/3636* (2013.01); *G06F 11/277* (2013.01); *G06F 11/3628* (2013.01); *G06F 11/3648* (2013.01); *G06F 11/3656* (2013.01); *G06F 11/3664* (2013.01); *G06F 17/5027* (2013.01)

(58) Field of Classification Search
CPC . G06F 11/277; G06F 11/3636; G06F 11/3648
USPC ........................................................ 717/129
See application file for complete search history.

(56) References Cited

U.S. PATENT DOCUMENTS

| 5,678,028 A | * | 10/1997 | Bershteyn | G06F 11/3664 |
| | | | | 714/28 |
| 5,995,744 A | | 11/1999 | Guccione | |
| 6,055,649 A | * | 4/2000 | Deao | G06F 11/2236 |
| | | | | 714/30 |
| 6,212,650 B1 | | 4/2001 | Guccione | |
| 6,263,489 B1 | | 7/2001 | Olsen et al. | |
| 6,744,274 B1 | * | 6/2004 | Arnold | G01R 31/31724 |
| | | | | 714/724 |

(Continued)

OTHER PUBLICATIONS

Mitra et al., "Post-Silicon Validation Opportunities, Challenges and Recent Advances", ACM, 2010, 6pg. (Year: 2010).*

(Continued)

*Primary Examiner* — Ryan D. Coyer
(74) *Attorney, Agent, or Firm* — LeRoy D. Maunu

(57) ABSTRACT

An approach for debugging a circuit implementation of a software specification includes translating a high-level language debugging command into a hardware debugging command that specifies the value(s) of a condition in the circuit implementation, and a storage element(s) at which the value(s) of the condition is stored. The hardware debugging command is transmitted to a debug controller circuit that generates a single clock pulse to the circuit implementation. The debug controller circuit reads a value(s) from the storage element(s) specified by the hardware debugging command and determines whether or not the value(s) satisfies the condition. The debug controller circuit generates another single clock pulse in response to the value(s) read from the storage element(s) not satisfying the condition. Generation of pulses of the clock signal is suspended and data indicative of a breakpoint is output in response to the value(s) read from the storage element(s) satisfying the condition.

20 Claims, 7 Drawing Sheets

(56) References Cited

U.S. PATENT DOCUMENTS

| | | | |
|---|---|---|---|
| 6,985,980 B1 | 1/2006 | Allegrucci | |
| 7,308,564 B1 | 12/2007 | Jenkins, IV | |
| 7,805,593 B1 | 9/2010 | Donlin | |
| 8,214,701 B1 | 7/2012 | Malhotra et al. | |
| 8,327,200 B1 | 12/2012 | Mohan | |
| 8,402,442 B1 | 3/2013 | Chan et al. | |
| 8,595,555 B1 | 11/2013 | Taylor | |
| 8,595,561 B1 | 11/2013 | Lu et al. | |
| 9,262,299 B1 | 2/2016 | Wilmot et al. | |
| 2006/0075298 A1* | 4/2006 | Drori | G06F 11/3648 714/30 |
| 2012/0051370 A1* | 3/2012 | Thevenon | H04L 43/50 370/466 |
| 2014/0146062 A1* | 5/2014 | Kiel | G06F 11/3664 345/522 |

OTHER PUBLICATIONS

Rootselaar et al., "Silicon Debug: Scan Chains Alone Are Not Enough", IEEE, 1999, 11pg. (Year: 1999).*

U.S. Appl. No. 15/334,182, Villarreal, Jason et al., filed Oct. 25, 2016.

U.S. Appl. No. 15/473,883, Villarreal, Jason et al., filed Mar. 30, 2017.

* cited by examiner

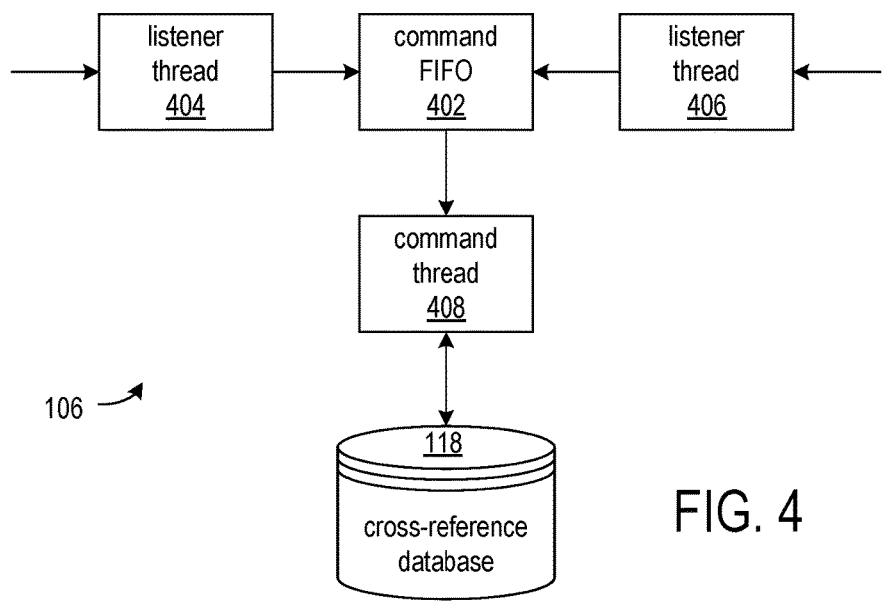
FIG. 4
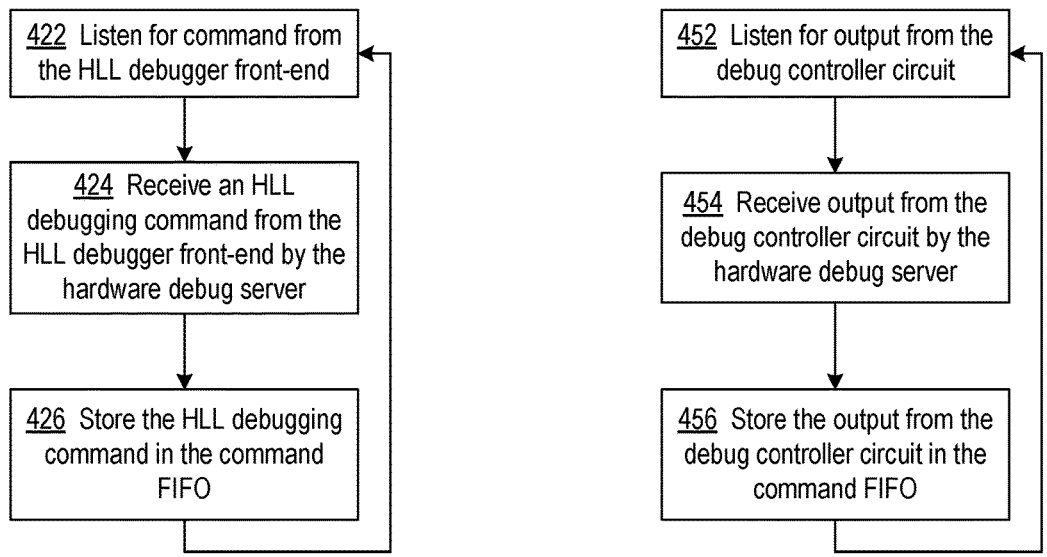
FIG. 5
FIG. 6

```
1: void vadd(const int* input, int* output)
2: {
3:   int counter ;
4:   unsigned int i ;
5:
6:   counter = 1 ;
7:   for (i = 0 ; i < 25 ; ++i)
8:   {
9:     output[i] = input[i] + counter ;
10:    counter += 1 ;
11:  }
12: }
```
702

```
// The RTL signals that correspond to
//   the high level language variable "counter"
reg [4:0] vadd_counter_reg_95;
reg [4:0] ap_pipeline_reg_iter1_vadd_counter_reg_95;
reg [4:0] ap_pipeline_reg_iter2_vadd_counter_reg_95;
reg [4:0] ap_pipeline_reg_iter3_vadd_counter_reg_95;
reg [4:0] ap_pipeline_reg_iter4_vadd_counter_reg_95;
reg [4:0] ap_pipeline_reg_iter5_vadd_counter_reg_95;
reg [4:0] ap_pipeline_reg_iter6_vadd_counter_reg_95;
reg [4:0] ap_pipeline_reg_iter7_vadd_counter_reg_95;
reg [4:0] ap_pipeline_reg_iter8_vadd_counter_reg_95;

// Additional HLS generated code...

// The RTL statement that executes the lines:
//   "counter += 1" and "counter = 1"
always @ (posedge ap_clk) begin
  if (((1'b1 == ap_CS_fsm_pp0_stage0)   &
       (1'b1 == ap_enable_reg_pp0_iter0) &
       (1'b0 == exitcond_fu_146_p2)))
  begin
    vadd_counter_reg_95 <= p_reg2mem_0_i_i_fu_152;
  end
  else if (((ap_CS_fsm_state1 == 1'b1) &
            ~(1'b0 == ap_start)))
  begin
    vadd_counter_reg_95 <= ap_const_lv5_0;
  end
end
```
704

FIG. 9

DEBUGGING SYSTEM AND METHOD

TECHNICAL FIELD

The disclosure generally relates to debugging software that has been transformed into a circuit description.

BACKGROUND

One technique for improving performance of a software system is to implement selected sections as hardware accelerators. Those sections of the system that exhibit high computational complexity and consume large portions of total runtime may be suitable candidates for implementing as hardware accelerators. The hardware accelerators could be application specific integrated circuits (ASICs), graphics processing units (GPUs), or circuitry running on field programmable gate arrays (FPGAs), for example. A common approach employed by software designers in creating a hardware accelerator is to use a high-level synthesis (HLS) tool to convert the original high-level language (HLL) specification of the identified section into an equivalent register transfer level (RTL) or other hardware description language (HDL) specification of the circuit.

Although the generated RTL specification may be functionally identical to the HLL specification, the software designer may need to debug the implemented circuit in the course of system development. Issues involving timing, concurrency and race conditions may have been masked when developing the HLL specification and can surface during hardware testing. Also, differences in software and hardware library implementations, incorrect translation, or differences in memory access can create implementation problems.

Debugging the circuit implementation in FPGA hardware can be facilitated by instrumenting the hardware design. Before synthesizing the circuit design, the designer can specify additional debug circuitry (integrated logic analyzers) to monitor individual signals. However, in order to specify the debug circuitry, the designer must know the internal, low level signals to trace and the triggers to set in order to generate a waveform. The designer may find that multiple synthesis iterations are necessary, with each iteration involving changing the design and tracing different signals.

SUMMARY

A disclosed method of debugging a circuit implementation of a software specification includes translating by a hardware debug server executing on a computer system, a first HLL debugging command into a hardware debugging command. The hardware debugging command specifies one or more values of a condition in the circuit implementation of the software specification on a programmable integrated circuit (IC), and one or more storage elements on the programmable IC at which the one or more values of the condition are stored. The first hardware debugging command is transmitted to a debug controller circuit on the programmable IC, and the debug controller circuit generates a single pulse of the clock signal to the circuit implementation of the software specification. After generating the single pulse, the debug controller circuit reads one or more values from the one or more storage elements specified by the hardware debugging command and determines whether or not the one or more values satisfy the condition. The debug controller circuit generates another single pulse of the clock signal in response to the one or more values read from the one or more storage elements not satisfying the condition. Generation of pulses of the clock signal is suspended in response to the one or more values read from the one or more storage elements satisfying the condition, and data indicative of a breakpoint is output in response to the one or more values read from the one or more storage elements satisfying the condition.

A disclosed debugging system includes a programmable integrated circuit (IC), a processor coupled to the programmable IC, and a memory arrangement coupled to the processor. The programmable IC includes a circuit implementation of a software specification and a debug controller circuit coupled to the circuit implementation. The memory arrangement is configured with instructions that when executed by the processor cause the processor translate, a first HLL debugging command into a hardware debugging command that specifies one or more values of a condition in the circuit implementation, and one or more storage elements on the programmable IC at which the one or more values of the condition are stored. The processor transmits the first hardware debugging command to the debug controller circuit. The debug controller circuit is configured to generate a single pulse of the clock signal to the circuit implementation of the software specification. The debug controller circuit, after generating the single pulse, reads one or more values from the one or more storage elements specified by the first hardware debugging command and determines whether or not the one or more values satisfy the condition. The debug controller circuit generates another single pulse of the clock signal in response to the one or more values read from the one or more storage elements not satisfying the condition. In response to the one or more values read from the one or more storage elements satisfying the condition, the debug controller circuit suspends generation of pulses of the clock signal and outputs data indicative of a breakpoint.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which:

FIG. 4 shows components of the hardware debug server in accordance with one implementation;

FIG. 5 shows a flowchart of a process that implements a first listener thread;

FIG. 6 shows a flowchart of a process that implements a second listener thread;

FIG. 9 shows an example of HLL source code and the equivalent sections of the HLS-generated RTL code dealing with HLL program variable, "counter.

DETAILED DESCRIPTION

Figure 1:
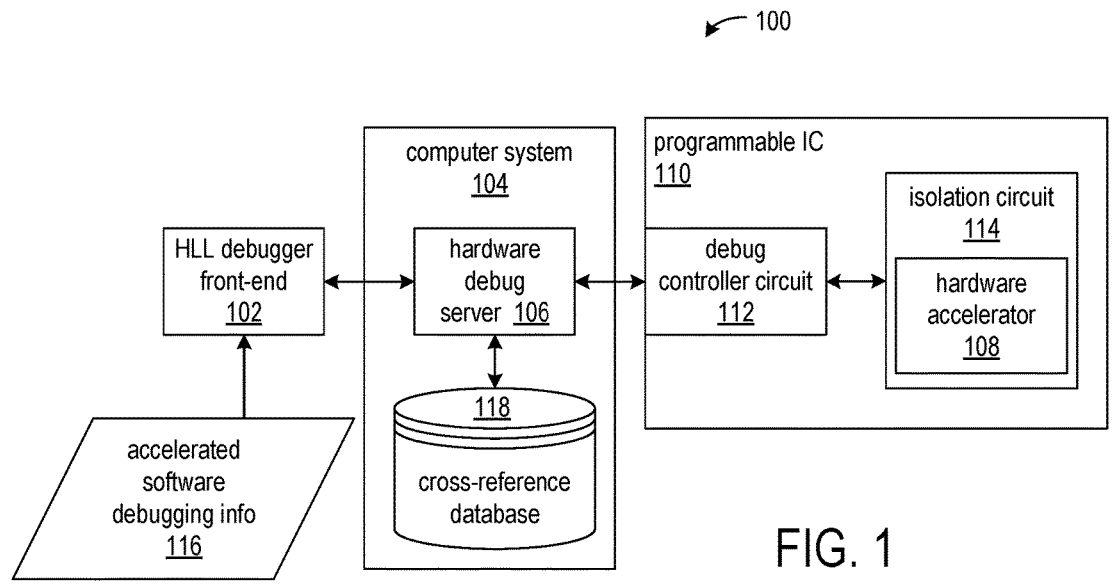
FIG. 1 shows an implementation of a system that supports debugging a hardware accelerator using software debugging techniques and approaches.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The debugging environment with which a software designer may be familiar differs substantially from a hardware debugging environment involving integrated logic analyzers and waveform viewers. Software debuggers provide capabilities such as setting breakpoints at specific instructions or lines of sequentially executing program code and inspecting and editing variables, the values of which may be stored in registers or memory during program execution. The software debugger presents debug information at the source code level, which allows the software designer to easily correlate desired actions of the software debugger and state of the executing program with HLL program names and statements.

The hardware debugging environment having an integrated logic analyzer and waveform viewer operates at the signal level. The integrated logic analyzer provides the ability to set breakpoints based on signal states, trace signal states, view waveforms, and inspect registers. However, the designer may be unfamiliar with the association between elements of the HLL program and the signal names and particular registers in the implemented circuit, because the implemented circuit was originally specified in an HLL. Thus, the designer can be hindered in debugging efforts.

The disclosed methods and systems bridge the gap between the software debugging environment with which software designers are familiar and the hardware debugging environment. The methods and systems support debugging features that are found in software debuggers, such as setting breakpoints at particular lines of HLL program code, inspecting the values of variables by HLL names of the variables and inspecting the contents of memory. The system handles mappings between HLL constructs and RTL constructs, and between the RTL constructs and circuit elements that implement the RTL constructs. The mappings and translations provided by the system allow the software designer to debug the hardware accelerator as if operating in the software debugger environment.

In the disclosed implementations, a hardware debug server executing on a computer system receives a debugging command from a software debugger front-end. The debugging command specifies setting a breakpoint in an HLL software specification. The hardware debug server translates the debugging command into a hardware debugging command. The hardware debugging command specifies one or more values of a condition in the circuit implementation of a software specification and specifies one or more storage elements at which the one or more values of the condition are stored. The circuit implementation operates on a programmable IC. The hardware debug server transmits the hardware debugging command to a debug controller circuit on the programmable IC, and the debug controller circuit generates a single pulse of the clock signal to the circuit implementation. The debug controller circuit then reads the value(s) from the storage element(s) specified by the hardware debugging command and determines whether or not the value(s) satisfy the condition. If the value(s) read from the storage element(s) do not satisfying the condition, the debug controller circuit generates another single pulse of the clock signal. If the value(s) read from the storage element(s) does satisfy the condition, the debug controller circuit outputs a signal indicative of the breakpoint and suspends generation of pulses of the clock signal until another command is received from the hardware debug server.

FIG. 1 shows an implementation of a system 100 that supports debugging a hardware accelerator using software debugging techniques and approaches. The system supports interaction between software debuggers, such as GDB, and the hardware accelerator generated from the HLL source code. The view of the hardware accelerator provided by the system is provided by a software debugger in debugging the HLL source code. The system includes an HLL debugger front-end 102, a hardware debug server 106, and a programmable IC 110 on which the hardware accelerator 108 and debug controller circuit 112 are implemented.

The hardware debug server executes on the computer system 104. In one implementation, the HLL debugger front-end can also execute on computer system 104. Alternatively, the debugger front-end can execute on another computer system (not shown) that is coupled to computer system 104 via a network interface to a network, such as a LAN or the Internet. The HLL debugger front-end 102 and hardware debug server 106 can be communicatively coupled using a protocol such as TCP/IP.

Some prior software debuggers, which support debugging software but not hardware accelerators, include a software debug server, which allows a debugger front-end executing on one computer system to control debugging of software executing on another computer system. In one implementation, the HLL debugger front-end 102 can be a part of a generally available software debugger such as the GNU debugger, GDB. The HLL debugger front-end uses debugging information in a standard format, for example DWARF information, in presenting the executing program state in terms of the original HLL source code. Variable names in the HLL source code are displayed with corresponding values read from hardware registers. In an example implementation, the HLL debugger front-end 102 communicates with the hardware debug server 106 using the same protocol as would be used for communication with a software debug server. In an implementation involving an HLL debugger front-end from GDB, the debugger front-end communicates with the hardware debug server using the Remote Serial Protocol (RSP), which is the same protocol the debugger front-end from GDB uses for communication with a software debug server.

The hardware debug server 106 translates commands and data between the debugger front-end 102 and the debug controller circuit 112. The hardware debug server connects to the debug controller circuit via a bus interface, such as PCIe, for example. The debug controller circuit controls the clock signal to the hardware circuit 108, which is the circuit implemented from the HLL program code, and handles interactions between the hardware debug server and the hardware accelerator by processing commands and returning values from the hardware accelerator. The hardware debug server allows the HLL debugger front-end to execute in the same manner in debugging the hardware accelerator as the HLL debugger front-end would in debugging software. The hardware debug server abstracts the hardware simulation semantics and details and presents a software-oriented view to the user.

In generating the hardware accelerator, an HLS tool also generates isolation circuit 114 to surround the hardware accelerator. The isolation circuit conforms to the interfaces specified in the HLL program code and is used to provide a barrier between the hardware accelerator and the rest of the circuitry on the programmable IC 110. The isolation circuit allows the debug controller circuit 112 to stop the clock signal to the hardware accelerator when in single-step mode or when a breakpoint has been hit, while the clock signal provided to other circuitry on the programmable IC remains active.

The accelerated software debugging information 116 is provided to the HLL debugger front-end 102 and includes the debugging symbols used to debug the source HLL program code from which the hardware accelerator 108 was generated. In an example implementation, the accelerated software debugging information 116 can be DWARF information generated by an HLS tool. The HLS tool generates an intermediate representation of the HLL program code and before optimization passes the intermediate representation through a process that generates a CPU-targeted executable and associated debugging information 116.

The accelerated software debugging information 116 is also used by the hardware debug server 106 in constructing the cross-reference database 118. The cross-reference database includes the accelerated software debugging information cross-referenced with the elements of an RTL state machine generated from the HLL program code and elements of the RTL state machine cross-referenced with elements of the hardware accelerator 108.

In a debugging scenario, the hardware debug server 106 receives from the debugger front-end, a high-level language (HLL) debugging command for setting a breakpoint in an HLL software specification. The person debugging the hardware accelerator interacts with the debugger front-end to select a particular instruction or line number in the HLL software specification from which the hardware accelerator 108 was generated. Those skilled in the art will recognize that known HLS tools can be used to generate a circuit design description and a corresponding hardware model suitable for simulation from HLL source code.

In response to receiving the HLL debugging command, the hardware debug server translates the HLL debugging command into a hardware debugging command that specifies a condition and one or more storage elements on the programmable IC 110 at which the one or more values of the condition are stored. The hardware debug server then communicates the hardware debugging command to the debug controller circuit 112. The debug controller circuit, in response to the hardware debugging command, determines after each cycle of the clock signal provided to the hardware accelerator, whether or not the condition of the breakpoint is satisfied. The breakpoint command specifies a storage element(s) of the programmable IC, and after generating a single pulse of the clock signal, the debug controller circuit reads a value(s) from the storage element(s). If the value(s) satisfies the condition of the breakpoint, the debug controller circuit suspends generation of clock pulses to the hardware accelerator and outputs a signal to the hardware debug server 106. If the value(s) does not satisfy the condition of the breakpoint, the debug controller circuit can provide another clock pulse to the hardware accelerator if operating a free-running clock mode. If operating in a single-step mode, the debug controller circuit waits for another command from the hardware debug server.

When the breakpoint is communicated to the hardware debug server, the hardware debug server determines the line number, instruction or statement of the HLL software specification that corresponds to the breakpoint. The hardware debug server then outputs the HLL line number, instruction or statement of the HLL software specification and an indication of the breakpoint to the HLL debugger front-end.

The data processing system(s) on which the hardware debug server 106 and HLL debugger front end 102 execute can include one or more processor circuits (or "processors"), e.g., a central processing unit (CPU) coupled to memory and storage arrangement through a system bus or other suitable circuitry. The system(s) stores program code that implements HLL debugger front end and the hardware debug server, and the processor(s) executes the program code accessed from the memory and storage arrangement via the system bus. The memory of the data processing system can include one or more physical memory devices such as, for example, a local memory and a persistent storage device. Local memory refers to random access memory or other non-persistent memory device(s) generally used during actual execution of the program code. Persistent storage can be implemented as a hard disk drive (HDD), a solid state drive (SSD), or other persistent data storage device. System 100 may also include one or more cache memories (not shown) that provide temporary storage of at least some program code and data in order to reduce the number of times program code and data must be retrieved from local memory and persistent storage during execution. The data processing system can further include input/output (I/O) devices such as user input device(s) and a display device. A network adapter of the data processing system can couple the system to other computer systems, remote printers, and/or remote storage devices through intervening private or public networks.

Figure 2:
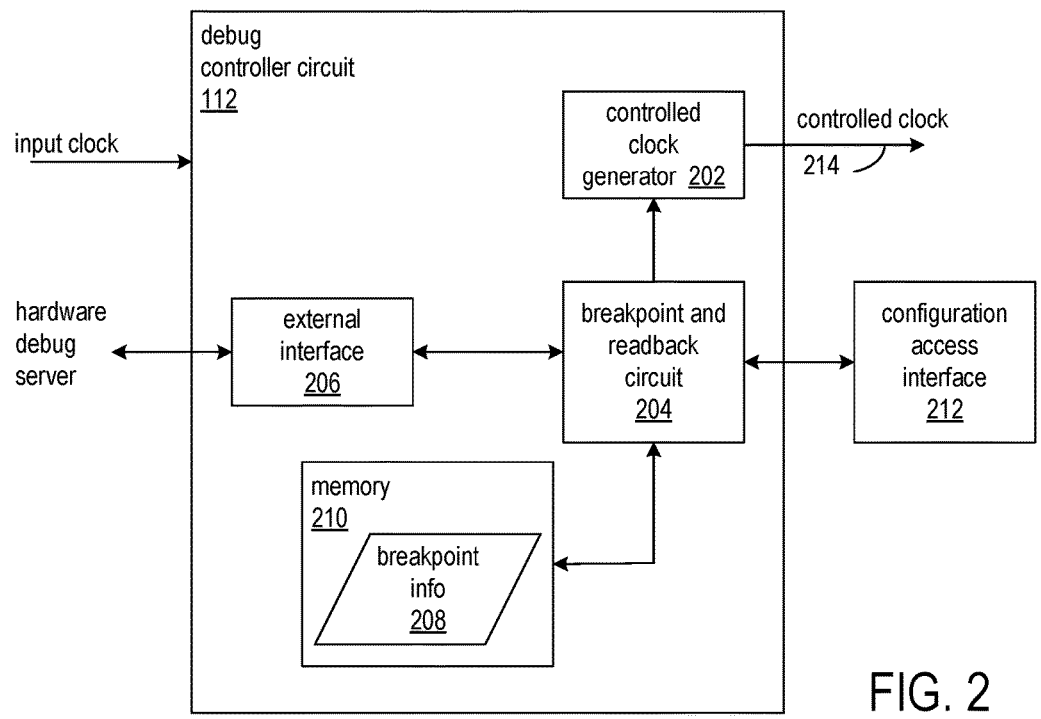
FIG. 2 shows a circuit diagram of a debug controller circuit in accordance with one implementation.

FIG. 2 shows a circuit diagram of a debug controller circuit 112 in accordance with one implementation. The debug controller circuit can be implemented either in programmable logic resources of the programmable IC or as a hardwired circuit. The controlled clock generator 202 of the debug controller circuit is configured to generate a controlled clock signal 214 that can be stopped, single-pulsed, or allowed to run freely at the frequency of the clock signal provided to the programmable IC. The controlled clock is provided to the hardware accelerator and gives the debug controller circuit the ability to step, halt, or freely run the hardware accelerator. The debug controller also has access to the configuration memory of the programmable IC, allowing for the reading and writing of values of variables. With the combination of a controlled clock and access to the configuration memory, the debug controller circuit implements hardware breakpoints and watchpoints by checking conditions after every cycle of the controlled clock signal.

The breakpoint and readback circuit 204 of the debug controller receives instructions via an external interface circuit 206, such as an AXI bus connection. The external interface circuit is also used to send variable data back and report when breakpoints have been hit. The debug controller circuit accepts instructions from the external interface, interprets the instructions, and performs the actions specified by the instructions. Commands to set a breakpoint, stop the hardware accelerator, run the hardware accelerator, read a variable, or run in breakpoint stepping mode are all accepted from the external interface.

When the debug controller receives an instruction to set a breakpoint, the breakpoint and readback circuit 204 stores breakpoint frame and offset information ("breakpoint info") 208 inside a local memory 210. The breakpoint information can specify frames and offsets of configuration memory elements of the programmable IC, and values that comprise a condition to check.

After the debug controller circuit has been programmed with breakpoint information, a start instruction causes the breakpoint and readback circuit 204 to start operation in debug mode. In debug mode, the breakpoint and readback circuit signals the controlled clock generator 202 to pulse the controlled clock signal once, which advances operation of the hardware accelerator by one clock cycle. After the pulse, the breakpoint and readback circuit generates signals to the configuration access interface circuit 212 for reading from configuration memory of the programmable IC. The configuration access interface circuit can be a circuit that is included as a standard feature on a programmable IC.

The breakpoint and readback circuit reads the breakpoint information 208 from the memory 210 in order to determine which locations in configuration memory are to be read. The breakpoint and readback circuit issues a read command to the configuration access interface 212, which reads the specified frames of configuration memory. Once the frames of data values are returned by the configuration access interface, the breakpoint and readback circuit parses the frame data and compares values at the designated offsets with the values of the breakpoint information read from the memory 210. When a condition of a breakpoint is satisfied, the breakpoint and readback circuit signals the controlled clock generator 202 to stop further pulsing of the controlled clock signal 214, and reports a breakpoint hit to the hardware debugger server via the external interface circuit 206. If no condition of a breakpoint is satisfied and the debug clock mode is free-running, the breakpoint and readback circuit clock signals the controlled clock generator 202 to once again single pulse the controlled clock signal 214, and the process repeats. If no condition of a breakpoint is satisfied and the debug clock mode is single-step, the breakpoint and readback circuit waits for another command from the hardware debug server and does not signal the controlled clock generator to single pulse the controlled clock signal until either a run or step command is received.

Figure 3:
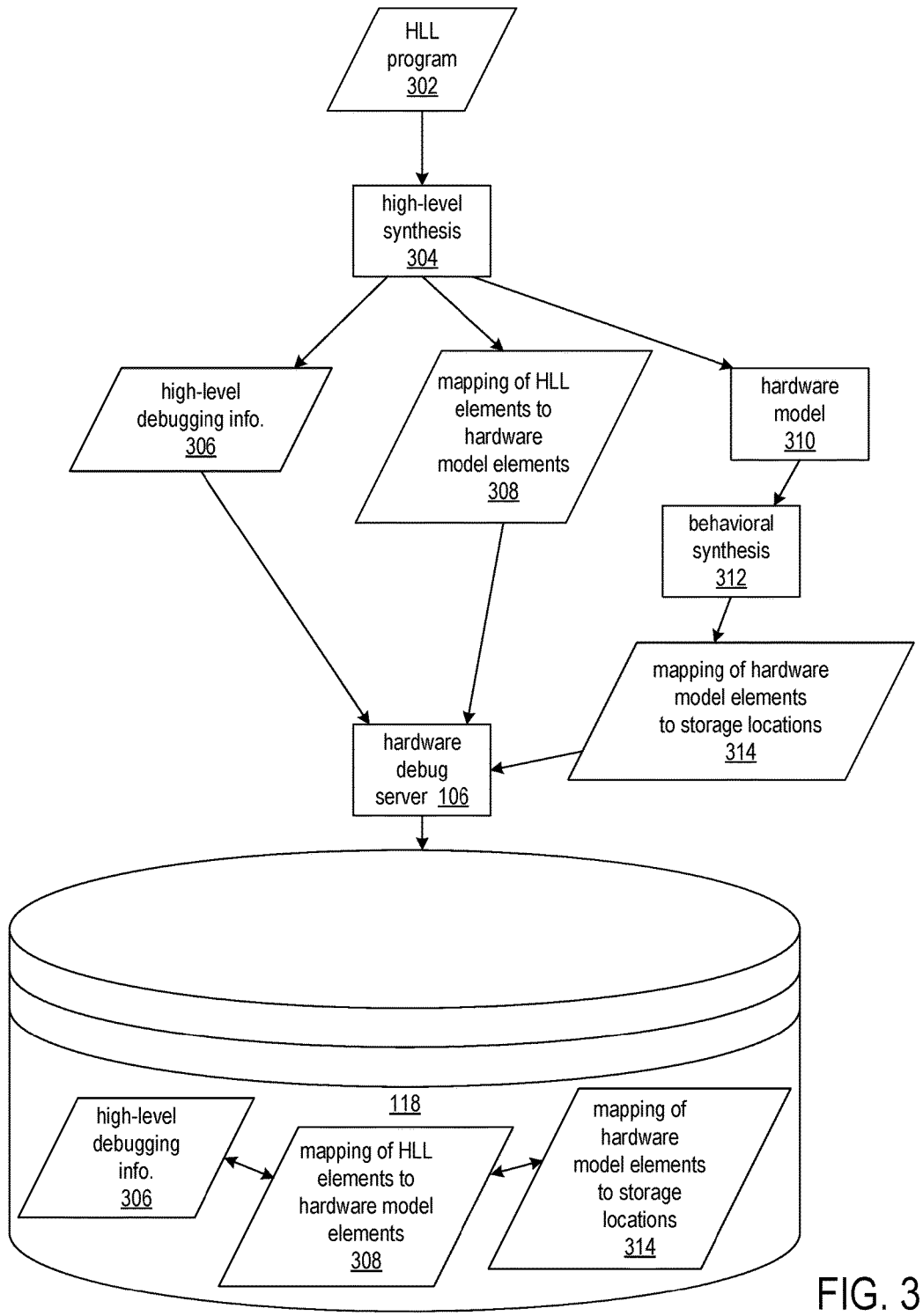
FIG. 3 is a dataflow diagram that illustrates generation of the cross-reference database.

FIG. 3 is a dataflow diagram that illustrates generation of the cross-reference database 118. The HLS tool 304 inputs the HLL program 302, which specifies the function to be implemented by a hardware accelerator. The HLS tool generates multiple versions of debugging information for use by the hardware debug server 106. At the beginning of the HLS tool flow, after front-end parsing but before optimization, the HLS tool generates an executable program (not shown) that is targeted to a particular CPU. The executable program has associated high-level debugging information 306 which is used to provide to the HLL debugger front-end (FIG. 1, #102), symbols relevant to the original HLL program 302. The high-level debugging information is also used by the hardware debug server 106 in building the cross-reference database 118. In one implementation, the high-level debugging information is DWARF debugging information.

In the optimization and scheduling passes of the HLS tool 304, the HLS tool generates the mapping information 308 and hardware model 310. The mapping information 308 specifies associations between elements of HLL program 302 and elements in the hardware model. The hardware model in one implementation can be an RTL finite state machine in which an active state specifies those statements of the HLL program processed concurrently during simulation.

The behavioral synthesis tool 312 inputs the hardware model 310 and in the process of generating configuration data for programming the programmable IC to implement the hardware accelerator, also generates a mapping of elements of the hardware model to elements or storage locations of configuration memory of the programmable IC. For example, the mapping information can specify elements of an RTL finite state machine mapped to frames and offsets of configuration memory of programmable logic.

The hardware debug server 106 inputs the high-level debugging information 306, mapping information 308, and mapping information 314 and generates cross-reference database 118, which cross-references the high-level debugging information 306 with the mapping of HLL elements to elements of the hardware model 308. The cross-reference database also includes mapping information 314, which cross references the elements of the hardware model with storage locations/elements of the programmable IC. The database 118 can be queried by the hardware debug server 106 during simulation using the hardware model to lookup elements of the hardware model and storage locations/elements that correspond to HLL program elements specified in commands from the debugger front-end (FIG. 1, #102), and to lookup HLL program elements that correspond to storage locations/elements referenced in data returned from the debug controller circuit (FIG. 1, #112). With the mapping information, breakpoints on line numbers, statements, or instructions of the HLL program can be accomplished with conditions that correspond to states of the hardware state machine and storage elements/locations of the programmable IC.

The construction of the mapping of lines in the HLL program 302 to which a breakpoint can be applied, to corresponding hardware state machine elements is dependent on the structure of the HLS-generated hardware model 310. In one implementation, the hardware model includes a finite state machine in which HLL statements correspond to conditions on RTL signals. By querying the cross-reference database 118, the hardware debug server 106 can translate breakpoint commands from the HLL debugger front-end into equivalent conditions on the hardware finite state machine. The conditions on the hardware finite state machine can be translated into conditions on storage locations/elements of the programmable IC. The translated breakpoint information can be input to the debug controller circuit 112, which stores the conditional breakpoint information in the local memory 208. The hardware debug server can translate commands from the software debugger front-end in which the commands request values of variables, into requests for values of hardware signals and variables from the debug controller by querying the cross-reference database.

Variables in the HLL program level have an intricate type system built on concrete base types defined by the language. When high level language programs are synthesized using HLS tools, the generated hardware will typically have the HLL types optimized and flattened into bit vectors. For example, the HLS tool might determine that a variable declared as "int" in the high level language only uses the seventeen low order bits and synthesize hardware that contains seventeen bit registers and bit-vectors as opposed to the thirty-two bit registers expected by the high level language.

The HLS tool captures the transformation of types in order to provide a complete mapping from the HLL constructs to RTL constructs. Table 1 shows a textual view of the type of mapping information used in translating types from HLL constructs into RTL constructs and vice versa. A direct mapping of each RTL type to the original type implies a conversion rule, such as sign extension or zero-extension. Additionally, the HLS tool may make the decision to create hardware where a high level language construct is stored in many different RTL registers or signals; the mapping specifies how these many RTL signals are assembled back into the original high level representation. The implementation and storage of this mapping can be done through a binary encoding.

TABLE 1

| HLL Type | RTL Type | Conversion Rule |
|---|---|---|
| int | [16:0] logic | Sign extend to 32-bits |
| float | [31:0] logic | Interpret 32-bits as floating point number |
| unsigned long long int | Two 32-bit logic vectors | Append vector 1 to vector 2 |

In the HLS-generated RTL, an HLL variable may be implemented as not just a single register, but as multiple registers and signals that may be active at different clock cycles or may all be simultaneously active based upon pipelining decisions made by the HLS tool. The mapping information 308 specifies the set of registers and signals that make up the state register for the finite state machine and any pipeline stage activation registers. Table 2 shows and example of a mapping location of location information for the HLL variable, "counter."

TABLE 2

| Finite State Machine + Pipeline configuration | Locations |
|---|---|
| 00001a78 | vadd_counter_reg_101 |
| 00001af* | ap_pipeline_reg_pp0_iter1_vadd_counter_reg_101 |
| 00001ff* | vadd_counter_reg_101, vadd_counter_reg_99 |
| <End of list> | |

For every HLL variable, the HLS tool creates a mapping from different configurations of these state registers to a list of other RTL signals that represent the active signals where that variable is located at that clock cycle. The textual example shown in Table 2 represents the binary encoding of the meta-data output by the HLS tool and includes wildcards to represent all permutations of particular bits as being valid for a single mapping.

Each line of source code in the original HLL program starts execution in the RTL code when a certain FSM state is active. States in the FSM are active when a certain RTL condition is true, such as when the state registers are in a certain configuration and when memory fetches have completed.

As shown textually in Table 3, the cross-reference database maintains a mapping of lines in the original HLL program to conditions in the generated RTL model that correspond to configurations that represent when an FSM state starts execution, including any generated pipeline information. Note that the mapping may not be one-to-one, because the generated RTL model may start several statements simultaneously or out of order in order to best utilize the available resources and maximize throughput.

TABLE 3

| High Level Language Breakable Lines | HLS-Generated Conditions/FSM States |
|---|---|
| main.c: 5 | CS_state13 == 1 && memReady == 1 |
| main.c: 6 | CS_state13 == 1 && memReady == 1 |
| main.c: 7 | CS_state155 == 1 |
| kernel.cpp: 15 | CS_state16 == 1 && Pipeline_16 == 1 |

The HLS tool converts pointer variables in the HLL program into RTL registers and signals. The actual memory that implements the pointer variables can be local RAM on the programmable IC or attached DDR memory. The mapping information output by the HLS tool and stored in the cross-reference database specifies the memory space partitioning and allocation so that the hardware debug server can dereference the pointers and follow the links to the stored values.

In order to support a software-centric view of the hardware accelerator circuitry operating on a programmable IC, elements of the hardware model are mapped to storage locations/elements of the programmable IC that implement the elements of the hardware model. The mapping information is generated during synthesis, place-and-route, and bitstream generation. The mapping information provides a direct link from the signals of the hardware model to storage locations/elements in the programmable IC. For example, in an FPGA, the storage locations/elements are specified as frames and offsets of the configuration memory. The mapping information supports inspection of the hardware accelerator during debug operations by way of user specification of variables and lines of code in the HLL program.

The example of Table 4 shows the associations between RTL signals and particular frames and offsets in configuration memory of the programmable IC on which the RTL signals are implemented.

TABLE 4

| Signal | Frame in configuration memory | Offset in frame |
|---|---|---|
| Top/design/vadd/counter[0] | 0x00021d9f | 2370 |
| Top/design/vadd/counter[0] | 0x00021de0 | 2200 |
| Top/design/vadd/axi/WREADY | 0x00021d9f | 2374 |

FIG. 4 shows components of the hardware debug server 106 in accordance with one implementation. The hardware debug server can be implemented as a multithreaded, stand-alone program having two listener threads 404 and 406 and a command thread 408. Listener thread 404 monitors the connection with the HLL debugger front-end for commands, and listener thread 406 monitors the connection with the debug controller circuit for responses. The listener threads 404 and 406 write commands and responses to the command first-in-first-out (FIFO) data structure 402. The command thread 408 reads commands and responses from the command FIFO, translates the commands and responses using the cross-reference database 118, transmits translated commands to the debug controller circuit and transmits translated responses to the HLL debugger front-end.

FIG. 5 shows a flowchart of a process that implements the listener thread 404. At block 422, the listener thread listens for a command from the HLL debugger front-end over a TCP/IP socket connection, for example. At block 424, the listener thread 404 receives an HLL debugging command, and at block 426, the listener thread stores the command in the command FIFO 402. The listener thread 426 then returns to block 422 to listen for another command from the HLL debugger front-end.

FIG. 6 shows a flowchart of a process that implements the listener thread 406. At block 452, the listener thread 406 listens for a response from the debug controller circuit over a PCIe connection, for example. At block 454, the listener thread 406 receives response output from the debug controller circuit, and at block 456, the listener thread stores the output in the command FIFO 402. The listener thread 406 then returns to block 452 to listen for another command from the HLL debugger front-end.

Figure 7:
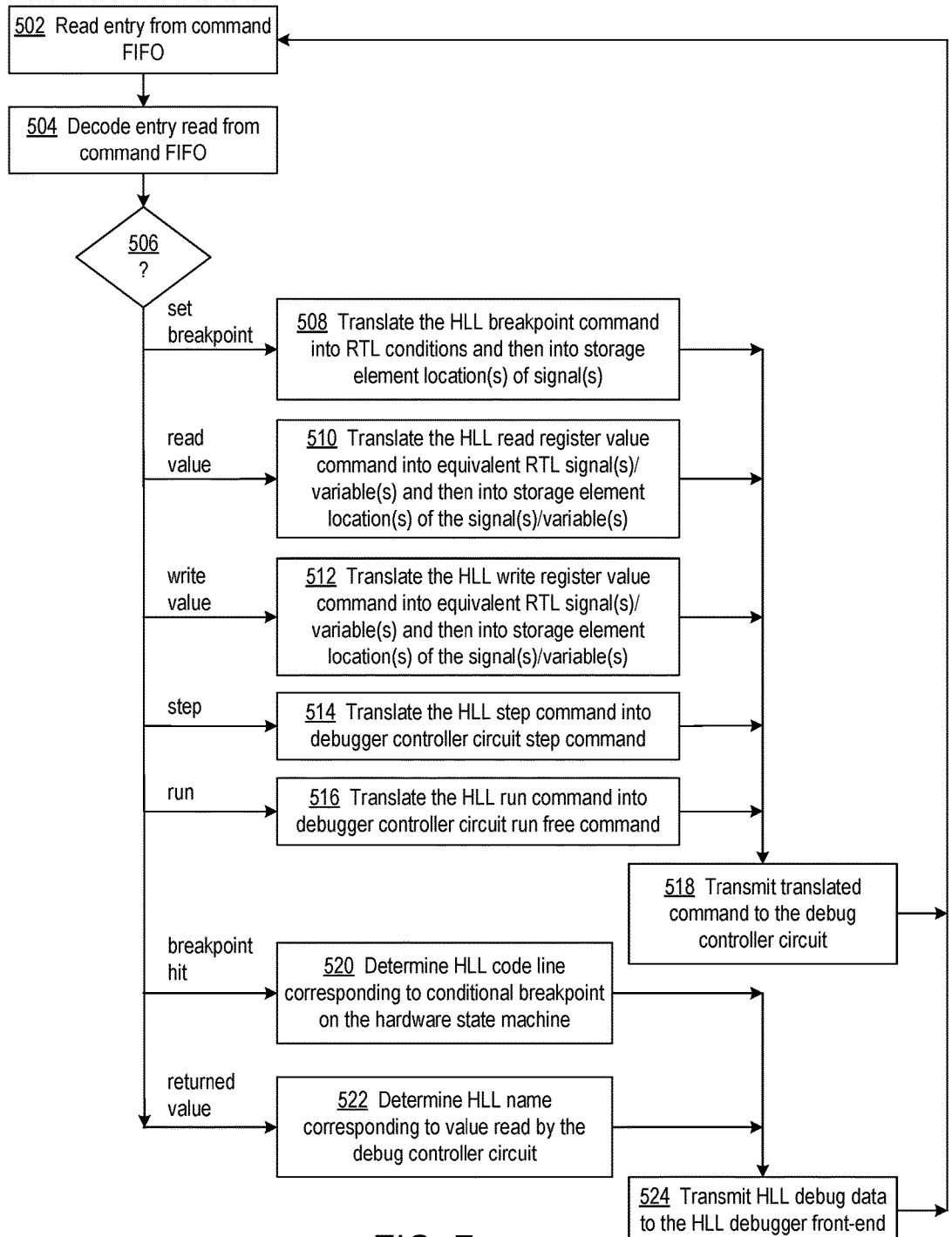
FIG. 7 shows a flowchart of a process that implements the command thread.

FIG. 7 shows a flowchart of a process that implements the command thread 408. At block 502, the command thread reads an entry from the command FIFO, and at block 504, the command thread decodes the command. The term "command" is used to reference both commands from the HLL debugger front-end and responses from the debug controller circuit as both commands and responses are stored in the command FIFO and processed by the command thread.

Decision block 506 switches processing by the command thread based on the decoding of block 504. The processing of blocks 508-518 is applicable to commands from the HLL debugger front-end, and the processing of blocks 520-524 is applicable to commands from the debug controller circuit.

If the decoded command is a breakpoint command, at block 508 the command thread translates the HLL breakpoint command into breakpoint information for the debug controller circuit. The command thread looks-up in the cross-reference database, the elements of the finite state machine that are associated with the HLL elements in the HLL breakpoint command. The command thread then looks-up in the cross-reference database the storage elements of the programmable IC that are associated with the elements of the finite state machine. The translated breakpoint command specifies the breakpoint condition and identifies the storage element(s) of the programmable IC referenced by the breakpoint condition.

If the decoded command specifies reading the value of an HLL variable, at block 510 the command thread translates the HLL command into a hardware debugging command for the debug controller circuit. The command thread looks-up in the cross-reference database, the element(s) of the finite state machine that is associated with the HLL element in the HLL debug read command. The command thread then looks-up in the cross-reference database the storage element(s) of the programmable IC that is associated with the element(s) of the finite state machine. The translated read command specifies a read operation and identifies the storage element(s) of the programmable IC referenced by the read operation.

If the decoded command specifies writing a value to an HLL variable, at block 512 the command thread translates the HLL command into a hardware debugging command for the debug controller circuit. The command thread looks-up in the cross-reference database, the element(s) of the finite state machine that is associated with the HLL element in the HLL debug write command. The command thread then looks-up in the cross-reference database the storage element(s) of the programmable IC that is associated with the element(s) of the finite state machine. The translated write command specifies a write operation and identifies the storage element(s) of the programmable IC referenced by the write operation.

If the decoded command specifies single-stepping the HLL program, at block 514 the command thread translates the command into a hardware debugging command for the debug controller circuit. The translated command specifies single stepping the controlled clock signal to the hardware accelerator.

If the decoded command specifies running the HLL program, at block 516 the command thread translates the command into a hardware debugging command for the debug controller circuit. The translated command specifies free-running the controlled clock signal to the hardware accelerator.

At block 518, the command thread transmits the translated command to the debug controller circuit, and then returns to block 502 to begin processing another command from the command FIFO.

If the decoded command indicates satisfaction of a breakpoint condition from the debug controller circuit, at block 520 the command thread translates the breakpoint information from the debug controller circuit into HLL breakpoint information for HLL debugger front-end.

The breakpoint information from the debug controller circuit specifies the breakpoint condition, one or more storage elements of the programmable IC, and one or more values read from the one or more storage elements. The command thread uses the cross-reference database to lookup the elements of the finite state machine that are associated with the storage elements identified in the breakpoint information. The command thread then uses the cross-reference database (e.g., Table 3) to determine which breakpoint corresponds to the breakpoint condition, values of the storage elements, and elements of the finite state machine. The command thread determines the line number of the HLL program code associated with the breakpoint from the cross-reference database and outputs to the HLL debugger front-end breakpoint data that indicates the line of the HLL program code.

If the decoded command indicates a value returned in response to a read command, at block 522 the command thread translates the value from the debug controller circuit into a value consistent with the HLL representation of the value (e.g., Table 1). The response from the debug controller circuit further specifies the storage element of the programmable IC from which the value was read. The command thread uses the cross-reference database to look up the element of the finite state machine that is associated with the storage element identified in the command and then looks up the HLL variable name associated with the element of the finite state machine. The command thread combines the translated value and HLL variable name into a response for the HLL debugger front-end.

At block 524, the command thread transmits the HLL debug data generated at blocks 520 and 522 to the HLL debugger front-end, and the process continues at block 502 to process further commands from the command FIFO.

Figure 8:
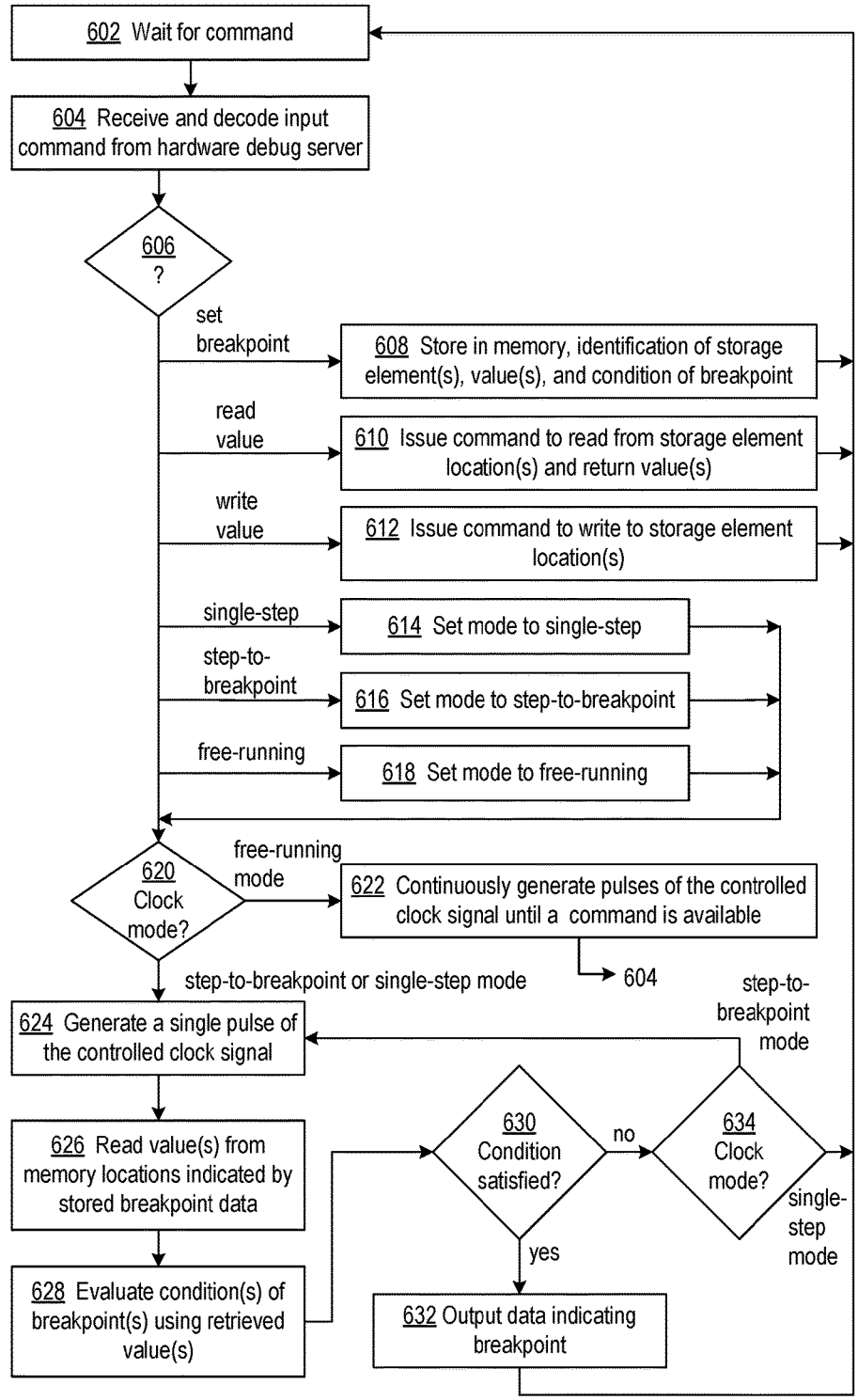
FIG. 8 is a flowchart of a process performed by the debug controller circuit in processing commands from the hardware debug server and reporting debug output from the hardware accelerator to the hardware debug server.

FIG. 8 is a flowchart of a process performed by the debug controller circuit in processing commands from the hardware debug server and reporting debug output from the hardware accelerator to the hardware debug server. At block 602, the debug controller circuit waits in an idle state for a command from the hardware debug server, and at block 604, the debug controller circuit receives and decodes a command from the hardware debug server.

Decision block 606 switches processing by the debug controller circuit based on the decoding of block 604. If the command is a breakpoint command, at block 608 the debug controller circuit stores in memory of the programmable IC, breakpoint information that specifies a breakpoint condition and one or more values, along with one or more storage elements. The process then returns to block 602 to wait for another command from the hardware debug server.

If the command is a read command, at block 610 the debug controller circuit issues a read command to the configuration access interface to read from the storage element(s) of the programmable IC specified in the command. The debug controller circuit returns the value(s) read from the configuration memory of the programmable IC to the hardware debug server and then waits for another command at block 602.

If the command is a write command, at block 612 the debug controller circuit issues a write command to the configuration access interface to write the value(s) specified in the write command to the storage element(s) of the programmable IC specified in the command. The debug controller circuit then waits for another command at block 602.

The debug controller circuit can provide the control clock signal to the hardware accelerator in a free-running mode, a single-step mode, or a step-to-breakpoint mode in response to translated commands provided by the hardware debug server. In response to a single-step command, at block 614 the debug controller circuit sets the clock mode to single-step mode. At block 616 the debug controller circuit sets the clock mode to step-to-breakpoint in response to a step-to-breakpoint command. In response to a free-running command, at block 618 the debug controller circuit sets the clock mode to free-running.

If the clock mode is free-running, decision block 620 directs the debug controller circuit to block 622, and the debug controller circuit continuously generates pulses of the controlled clock signal until another command is available. When another command is available, the process continues at block 604. While operating in the free-running mode, the debugging controller circuit bypasses reading values from memory locations and determining whether the condition of a breakpoint is satisfied.

In the single-step and step-to-breakpoint clock modes, at block 624, the debug controller circuit generates a single pulse of the controlled clock signal to the hardware accelerator. After generating the single pulse of the controlled clock signal, at block 626 the debug controller circuit reads value(s) from the storage element(s) identified in the breakpoint information stored in the local memory.

At block 628, the debug controller circuit evaluates the condition(s) specified in the breakpoint information using the value(s) read form the configuration memory of the programmable IC. If the condition of a breakpoint is satisfied, decision block 630 directs the process to block 632 at which the debug controller circuit outputs data indicating the breakpoint was satisfied. The data can be specified in a breakpoint message and indicate the information of the satisfied breakpoint. In response to satisfaction of a breakpoint, the debug controller circuit returns to block 602 to wait for another command from the hardware debug server.

If no breakpoint condition is satisfied, the debug controller at decision block 634 proceeds according to the clock mode. If the clock mode is step-to-breakpoint, the debug controller circuit generates another single pulse of the controlled clock signal to the hardware accelerator at block 624. If the clock mode is single-step, the debug controller proceeds to block 602 to wait for another command.

FIG. 9 shows an example of HLL source code 702 and the equivalent sections of the HLS-generated RTL code 704 dealing with HLL program variable, "counter." The HLL source code has 12 numbered lines including a function statement, variable declarations, assignment statements, a control statement, scope delimiters, and a blank line.

The HLL variable "counter" maps to the 5-bit registers in RTL, each of which is active during different stages of the generated FSM machine. The registers include:

reg [4:0] vadd_counter_reg_95;
reg [4:0] ap_pipeline_reg_iter1_vadd_counter_reg_95;
reg [4:0] ap_pipeline_reg_iter2_vadd_counter_reg_95;
reg [4:0] ap_pipeline_reg_iter3_vadd_counter_reg_95;
reg [4:0] ap_pipeline_reg_iter4_vadd_counter_reg_95;
reg [4:0] ap_pipeline_reg_iter5_vadd_counter_reg_95;
reg [4:0] ap_pipeline_reg_iter6_vadd_counter_reg_95;
reg [4:0] ap_pipeline_reg_iter7_vadd_counter_reg_95;
reg [4:0] ap_pipeline_reg_iter8_vadd_counter_reg_95;

The HLL statement, counter+=1; maps to the "if" portion of the always block and the RTL statement, vadd_counter_reg_95<=p_reg2mem_0_i_i_fu_152;

is executed in the simulation when the condition (ap_CS_fsm_pp0_stage0==1'b1) & (ap_enable_reg_pp0_iter0==1'b1) & (exitcond_fu_146_p2==1'b0) is true on a positive edge of the main clock.

The HLL statement, counter=1; maps to the "else if" portion of the always block, and the RTL statement, vadd_counter_reg_95<=ap_const_lv5_0;

is executed in the simulation when the condition, (ap_CS_fsm_state1==1'b1) & ~(ap_start==1'b0) is true on a positive edge of the main clock.

In response to receiving from the HLL debugger front-end 102 breakpoint commands specifying the HLL lines 6 and 10, the hardware debug server 106 translates the HLL breakpoint commands into breakpoint information that specifies breakpoint conditions and storage elements of the programmable IC and transmits the breakpoint information to the debug controller circuit 112. The debug controller circuit stores the breakpoint information in its local memory. In response to a command from the debugger front-end to set a breakpoint at HLL code line 6, the hardware debug server generates breakpoint information that causes the debug controller circuit to stop providing a clock pulse to the hardware accelerator when the condition (ap_CS_fsm_state1==1'b1) & ~(ap_start==1'b0) is true on a positive edge of the main clock, which is before the hardware accelerator performs the function of RTL statement vadd_counter_reg_95<=ap_const_lv5_0. In response to a command from the HLL debugger front-end to set a breakpoint at HLL code line 10, the hardware debug server generates breakpoint information that causes the debug controller circuit to stop providing a clock pulse to the hardware accelerator when the condition (ap_CS_fsm_pp0_stage0==1'b1) & (ap_enable_reg_pp0_iter0==1'b1) & (exitcond_fu_146_p2==1'b0) is true on a positive edge of the main clock, which is before the hardware accelerator performs the function of RTL statement, vadd_counter_reg_95<=p_reg2mem_0_i_i_fu_152.

Figure 10:
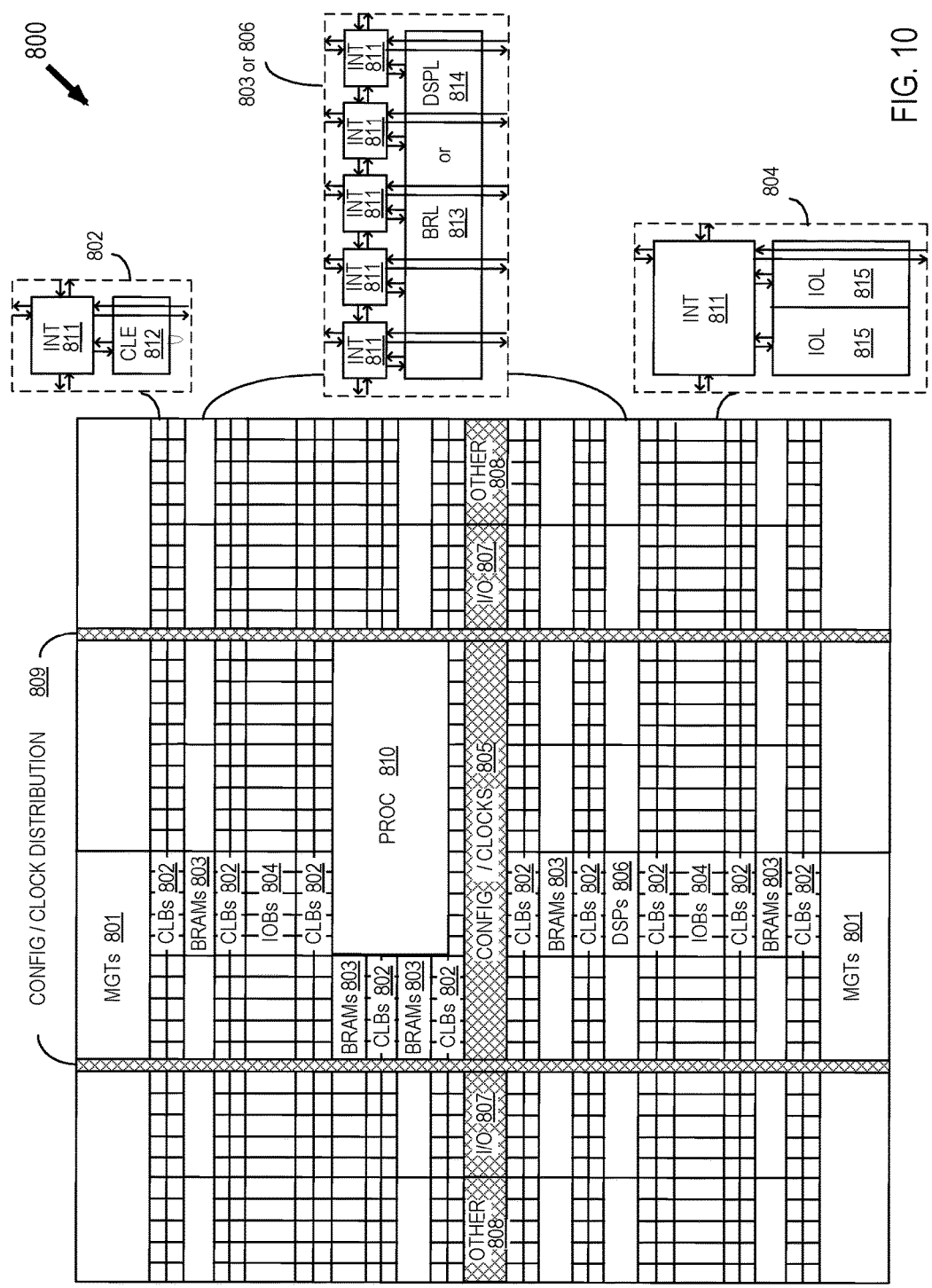
" and FIG. 10 shows a programmable integrated circuit (IC) on which the debug controller circuit and hardware accelerator can be implemented

FIG. 10 shows a programmable integrated circuit (IC) 800 on which the debug controller circuit and hardware accelerator can be implemented. The programmable IC may also be referred to as a System On Chip (SOC) that includes field programmable gate array logic (FPGA) along with other programmable resources. FPGA logic may include several different types of programmable logic blocks in the array. For example, FIG. 10 illustrates programmable IC 800 that includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some programmable IC having FPGA logic also include dedicated processor blocks (PROC) 810 and internal and external reconfiguration ports (not shown).

In some FPGA logic, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA logic. The programmable interconnect element INT 811 also includes the connections to and from the programmable logic element within the same tile, as shown by the examples included at the top of FIG. 10.

For example, a CLB 802 can include a configurable logic element CLE 812 that can be programmed to implement user logic, plus a single programmable interconnect element INT 811. A BRAM 803 can include a BRAM logic element (BRL) 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element (DSPL) 814 in addition to an appropriate number of programmable interconnect elements. An IOB 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

In the pictured embodiment, a columnar area near the center of the die (shown shaded in FIG. 10) is used for configuration, clock, and other control logic. Horizontal areas 809 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 10 include additional logic blocks that disrupt the regular columnar structure making up a large part of the programmable IC. The additional logic blocks can be programmable blocks and/or dedicated logic. For example, the processor block PROC 810 shown in FIG. 10 spans several columns of CLBs and BRAMs.

Note that FIG. 10 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual programmable IC, more than one adjacent column of CLBs is typically included wherever the CLBs appear, to facilitate the efficient implementation of user logic.

Certain implementations are directed to a computer program product (e.g., nonvolatile memory device), which includes a machine or computer-readable medium having stored thereon instructions which may be executed by a computer (or other electronic device) to perform these operations/activities.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for debugging circuit designs. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method of debugging, comprising:
translating by a hardware debug server executing on a computer system, a first high-level language (HLL) debugging command into a first hardware debugging command that specifies one or more values of a condition in a circuit implementation of an HLL software specification on a programmable integrated circuit (IC), and one or more storage elements on the programmable IC at which the one or more values of the condition are stored;
transmitting the first hardware debugging command to a debug controller circuit on the programmable IC;
generating a single pulse of a clock signal to the circuit implementation of the software specification by the debug controller circuit;
reading by the debug controller circuit after generating the single pulse, one or more values from the one or more storage elements specified by the first hardware debugging command;
determining whether or not the one or more values satisfy the condition;
generating another single pulse of the clock signal in response to the one or more values read from the one or more storage elements not satisfying the condition;
suspending generation of pulses of the clock signal in response to the one or more values read from the one or more storage elements satisfying the condition; and
outputting a data indicative of a breakpoint in response to the one or more values read from the one or more storage elements satisfying the condition.

2. The method of claim 1, further comprising:
wherein the outputting the data includes transmitting a breakpoint message by the debug controller circuit to the hardware debug server, and the breakpoint message specifies the one or more storage elements and the one or more values read from the one or more storage elements;
determining by the hardware debug server, a line of the HLL software specification that corresponds to the one or more values and the one or more storage elements specified in the breakpoint message; and
outputting by the hardware debug server, data indicating the line of the HLL software specification.

3. The method of claim 2, wherein the translating includes determining from a cross-reference database, one or more elements of a hardware finite state machine, cross-referenced with one or more HLL elements specified in the first HLL debugging command, and the one or more storage elements of the programmable IC that are cross-referenced with the one or more elements of the hardware finite state machine.

4. The method of claim 3, wherein the determining the line of the HLL software specification includes determining from the cross-reference database, the line of the HLL software specification, cross-referenced with an element of the hardware finite state machine indicated by the breakpoint.

5. The method of claim 1, further comprising:
translating by the hardware debug server, a second HLL debugging command into a second hardware debugging command, wherein the second HLL debugging command specifies a read request and a name of a variable in the HLL software specification, and the second hardware debugging command specifies a read request and a storage element of the programmable IC;
transmitting the second hardware debugging command to the debug controller circuit on the programmable IC;
reading by the debug controller circuit, a value of the storage element specified in the second hardware debugging command;
transmitting a first response to the second hardware debugging command from the debug controller circuit to the hardware debug server, the first response including an identification of the storage element and the value of the storage element;
translating the first response into a second response having the name of the variable and the value of the storage element; and
outputting the second response by the hardware debug server.

6. The method of claim 1, further comprising, storing by the debug controller circuit in memory of the programmable IC, the one or more values and specification of the one or more storage elements in response to the first hardware debugging command.

7. The method of claim 6, wherein the specification of the one or more storage elements specifies a frame and an offset of configuration memory of the programmable IC.

8. The method of claim 1, further comprising:
translating by the hardware debug server, a second HLL debugging command for running the HLL software specification into a second hardware debugging command that specifies free-running the clock signal to the circuit implementation of the software specification on the programmable IC;
transmitting the second hardware debugging command to the debug controller circuit;
setting a clock mode by the debug controller circuit to free-running mode;
continuously generating pulses of the clock signal to the circuit implementation of the software specification by the debug controller circuit in response to the free-running mode; and
bypassing the reading of the one or more values and the determining whether the one or more values satisfy the condition in response to the free-running mode.

9. The method of claim 1, further comprising:
translating by the hardware debug server, a second HLL debugging command for single-stepping the HLL software specification into a second hardware debugging command that specifies single stepping the clock signal to the circuit implementation of the software specification on the programmable IC;
transmitting the second hardware debugging command to the debug controller circuit;
setting a clock mode by the debug controller circuit to single-step;
wherein the generating the single pulse of the clock signal is in response to the second hardware debugging command; and
wherein the generating the another single pulse of the clock signal is further in response to another hardware debugging command that specifies single stepping the clock signal.

10. The method of claim 1, further comprising:
translating by the hardware debug server, a second HLL debugging command into a second hardware debugging command, wherein the second HLL debugging command specifies a write request, a name of a variable in the HLL software specification, and a value, and the second hardware debugging command specifies a write request, a storage element of the programmable IC, and the value;
transmitting the second hardware debugging command to the debug controller circuit on the programmable IC; and
writing by the debug controller circuit, the value to the storage element specified in the second hardware debugging command.

11. A debugging system, comprising:
a programmable integrated circuit (IC), wherein the programmable IC includes a circuit implementation of a high-level language (HLL) software specification and a debug controller circuit coupled to the circuit implementation;
a processor coupled to the programmable IC; and
a memory arrangement coupled to the processor, wherein the memory arrangement is configured with instructions that when executed by the processor cause the processor to perform operations including:
translating a first HLL debugging command into a first hardware debugging command that specifies one or more values of a condition in the circuit implementation, and one or more storage elements on the programmable IC at which the one or more values of the condition are stored; and
transmitting the first hardware debugging command to the debug controller circuit;
wherein the debug controller circuit is configured to:
generate a single pulse of a clock signal to the circuit implementation of the software specification;
read, after generating the single pulse, one or more values from the one or more storage elements specified by the first hardware debugging command;
determine whether or not the one or more values satisfy the condition;
generate another single pulse of the clock signal in response to the one or more values read from the one or more storage elements not satisfying the condition;
suspend generation of pulses of the clock signal in response to the one or more values read from the one or more storage elements satisfying the condition; and
output data indicative of a breakpoint in response to the one or more values read from the one or more storage elements satisfying the condition.

12. The system of claim 11, wherein:
the debug controller circuit is further configured to transmit a breakpoint message to the hardware debug server, and the breakpoint message specifies the one or more storage elements and the one or more values read from the one or more storage elements; and the memory arrangement is further configured with instructions that when executed by the processor cause the processor to:

determine by the hardware debug server, a line of the HLL software specification that corresponds to the one or more values and the one or more storage elements specified in the breakpoint message; and output by the hardware debug server, data indicating the line of the HLL software specification.

13. The system of claim 12, wherein the instructions for translating include instructions for determining from a cross-reference database, one or more elements of a hardware finite state machine, cross-referenced with one or more HLL elements specified in the first HLL debugging command, and the one or more storage elements of the programmable IC cross-referenced with the one or more elements of the hardware finite state machine.

14. The system of claim 13, wherein the instructions for determining the line of the HLL software specification include instructions for determining from the cross-reference database, the line of the HLL software specification, cross-referenced with an element of the hardware finite state machine indicated by the breakpoint.

15. The system of claim 11, wherein:
the memory arrangement is further configured with instructions that when executed by the processor cause the processor to:
    translate by the hardware debug server, a second HLL debugging command into a second hardware debugging command, wherein the second HLL debugging command specifies a read request and a name of a variable in the HLL software specification, and the second hardware debugging command specifies a read request and a storage element of the programmable IC; and
    transmit the second hardware debugging command to the debug controller circuit on the programmable IC;
the debug controller circuit is further configured to:
    read, a value of the storage element specified in the second hardware debugging command; and
    transmit a first response to the second hardware debugging command to the hardware debug server, the first response including an identification of the storage element and the value of the storage element; and
the memory is further configured with instructions that when executed by the processor cause the processor to:
    translate the first response into a second response having the name of the variable and the value of the storage element; and
    output the second response by the hardware debug server.

16. The system of claim 11, wherein the debug controller circuit is further configured to store in memory of the programmable IC, the one or more values and specification of the one or more storage elements in response to the first hardware debugging command.

17. The system of claim 16, wherein the specification of the one or more storage elements specifies a frame and an offset of configuration memory of the programmable IC.

18. The system of claim 11, wherein:
the memory arrangement is further configured with instructions that when executed by the processor cause the processor to:
    translate a second HLL debugging command for running the HLL software specification into a second hardware debugging command that specifies free-running the clock signal to the circuit implementation of the software specification on the programmable IC; and
    transmit the second hardware debugging command to the debug controller circuit;
the debug controller circuit is further configured to:
    set a clock mode by the debug controller circuit to free-running mode;
    continuously generate pulses of the clock signal to the circuit implementation of the software specification in response to the free-running mode; and
    bypass the reading of the one or more values and the determining whether the one or more values satisfy the condition in response to the free-running mode.

19. The system of claim 11, further comprising:
the memory arrangement is further configured with instructions that when executed by the processor cause the processor to:
    translate a second HLL debugging command for single-stepping the HLL software specification into a second hardware debugging command that specifies single stepping the clock signal to the circuit implementation of the software specification on the programmable IC; and
    transmit the second hardware debugging command to the debug controller circuit;
the debug controller circuit is further configured to set a clock mode to single-step;
the generation of the single pulse of the clock signal is in response to the second hardware debugging command; and
the generation of the another single pulse of the clock signal is further in response to another hardware debugging command that specifies single stepping the clock signal.

20. The system of claim 11, wherein:
the memory arrangement is further configured with instructions that when executed by the processor cause the processor to:
    translate a second HLL debugging command into a second hardware debugging command, wherein the second HLL debugging command specifies a write request, a name of a variable in the HLL software specification, and a value, and the second hardware debugging command specifies a write request, a storage element of the programmable IC, and the value; and
    transmit the second hardware debugging command to the debug controller circuit on the programmable IC; and
the debug controller circuit is further configured to write the value to the storage element specified in the second hardware debugging command.

* * * * *